(12) United States Patent
Aratake

(10) Patent No.: US 8,444,801 B2
(45) Date of Patent: May 21, 2013

(54) ANODIC BONDING METHOD AND PIEZOELECTRIC VIBRATOR MANUFACTURING METHOD

(75) Inventor: Kiyoshi Aratake, Chiba (JP)

(73) Assignee: Seiko Instruments Inc., Chiba (JP)

( * ) Notice: Subject to any disclaimer, the term of this patent is extended or adjusted under 35 U.S.C. 154(b) by 345 days.

(21) Appl. No.: 12/869,098

(22) Filed: Aug. 26, 2010

(65) Prior Publication Data

US 2011/0048633 A1 Mar. 3, 2011

(30) Foreign Application Priority Data

Aug. 26, 2009 (JP) ................................ 2009-195965

(51) Int. Cl.
  *B29C 65/14* (2006.01)
(52) U.S. Cl.
  USPC ...................................... 156/274.4; 156/273.7
(58) Field of Classification Search
  USPC ............. 156/150, 272.2, 273.1, 379.6, 273.7, 156/274.4, 272.4; 438/107, 109, 455, 456, 438/459; 65/36, 40
  See application file for complete search history.

(56) References Cited

U.S. PATENT DOCUMENTS 3,397,278 A * 8/1968 Pomerantz ..................... 257/650
2005/0161153 A1 * 7/2005 Hofmann et al. .......... 156/272.2

FOREIGN PATENT DOCUMENTS

JP 63-229853 A 9/1988

* cited by examiner

*Primary Examiner* — Khanh Nguyen
*Assistant Examiner* — Vishal I Patel
(74) *Attorney, Agent, or Firm* — Brinks Hofer Gilson & Lione

(57) ABSTRACT

An anodic bonding method of anodically bonding a base wafer 10 and a lid wafer 11 includes: (1) superimposing the base wafer 10 and the lid wafer 11 onto each other in a direction where a bonding film 9 faces a cavity C; (2) subsequent to the superimposition step, pressurizing and holding the base wafer 10 and the lid wafer 11 in a vacuum state in the superimposition direction; and (3) subsequent to the pressurizing step, partitioning and setting a plurality of intended bonding areas A1, A2, A3 and A4 in a concentric form on a contacting surface where the base wafer 10 and the lid wafer 11 are in contact with each other and applying a DC voltage to each of the plurality of intended bonding areas A1, A2, A3 and A4.

16 Claims, 9 Drawing Sheets

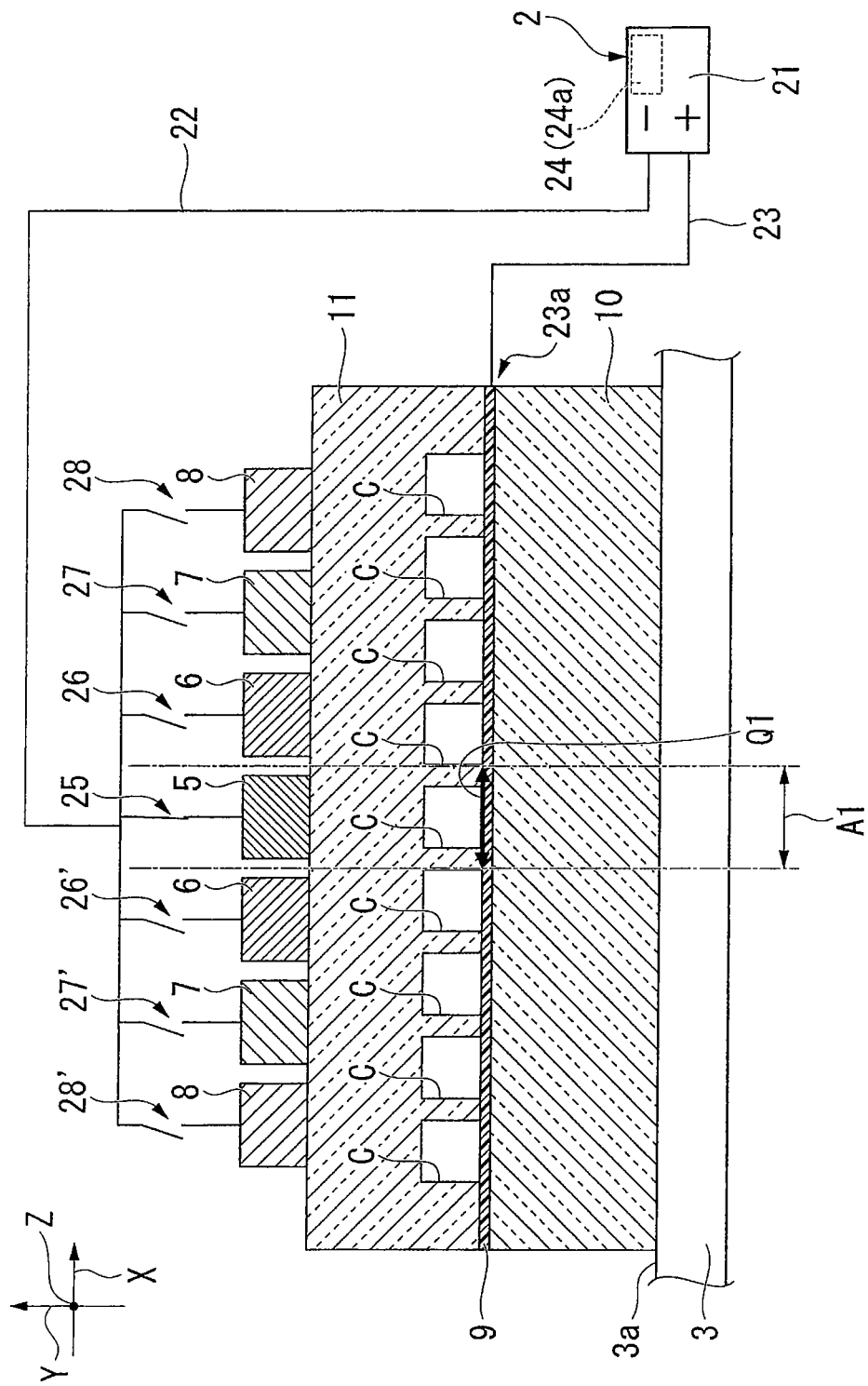

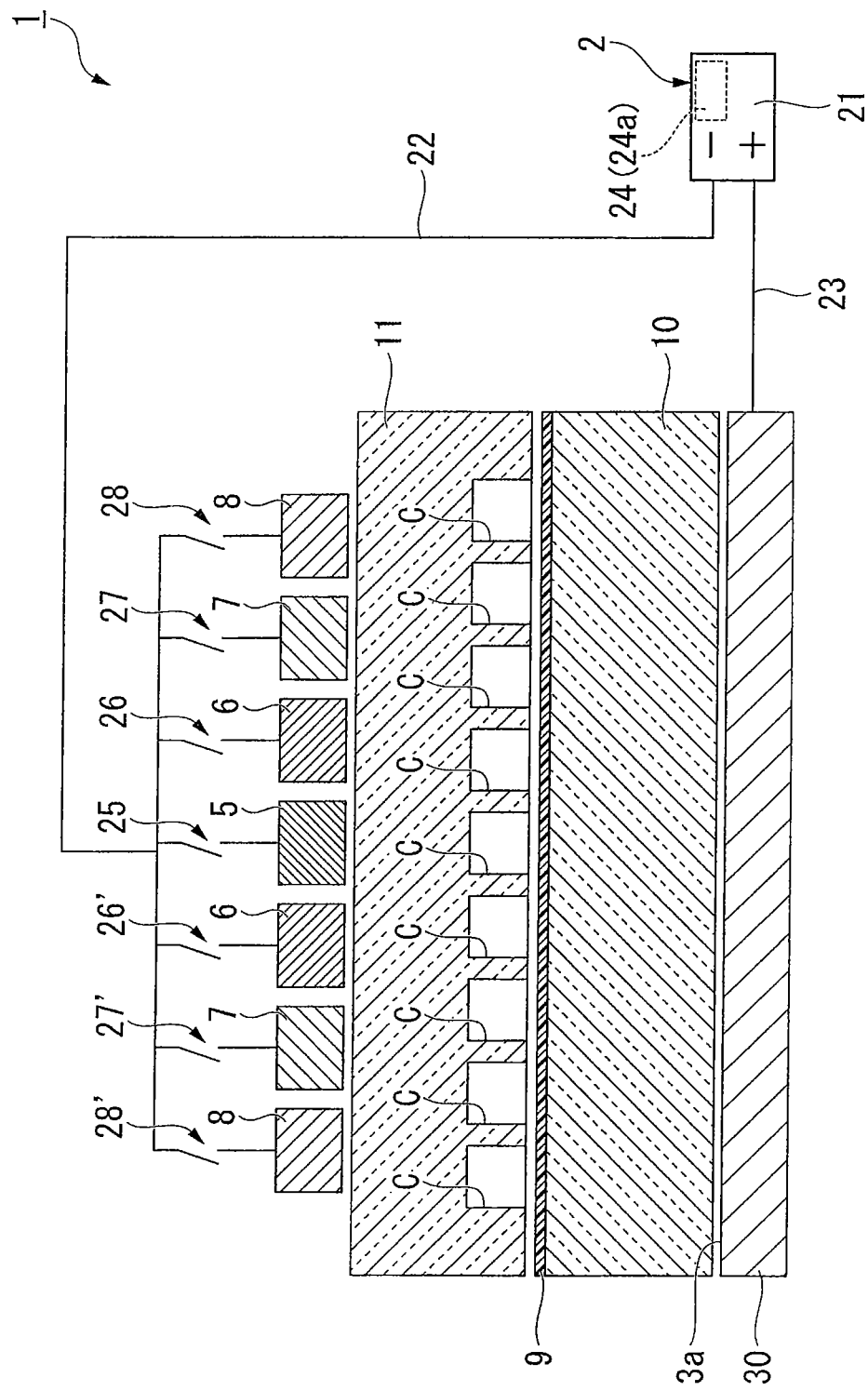

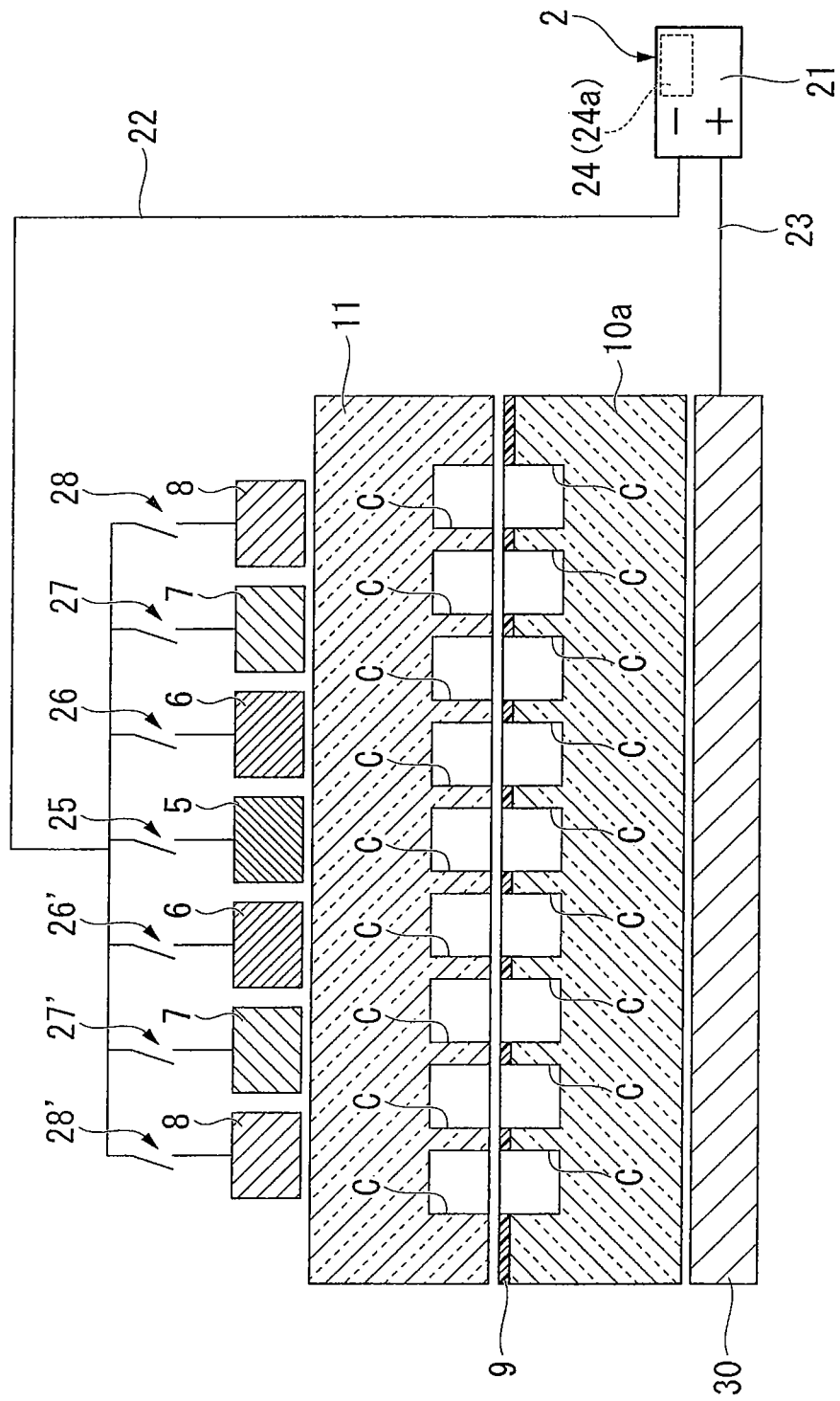

ANODIC BONDING METHOD AND PIEZOELECTRIC VIBRATOR MANUFACTURING METHOD

RELATED APPLICATIONS

This application claims priority under 35 U.S.C. §119 to Japanese Patent Application No. 2009-195965 filed on Aug. 26, 2009, the entire content of which is hereby incorporated by reference.

BACKGROUND OF THE INVENTION

1. Field of the Invention

The present invention relates to an anodic bonding method and a piezoelectric vibrator manufacturing method.

2. Description of the Related Art

In the related art, in the manufacturing process of piezoelectric vibrators or semiconductor components, anodic bonding has been performed to bond a silicon wafer or the like to the surface of an insulating material such as glass.

The anodic bonding is a method of bringing metal, silicon, or the like to be bonded into contact with one surface of an insulating material such as glass and bringing a cathode made of metal into contact with the other surface of the insulating material, thus bonding the metal and the insulating material together with the application of a DC voltage under a temperature condition of 300° C. to 400° C.

In such an anodic bonding method, the surfaces which face each other so as to bond the metal and the insulating material together have micro unevenness, warping, or the like. Therefore, the entire bonding surfaces are not closely adhered at the same time, but in many cases, between the metal and the insulating material, a bonding portion widens concentrically on the bonding surfaces from a plurality of contact points. Thus, there is a problem in that air is trapped in areas between a plurality of bonding portions, which remain unbonded all the way on the bonding surfaces, and voids are formed in the non-bonded areas.

As an anodic bonding method for suppressing such voids, JP-A-63-229853 discloses an anodic bonding method which uses an anodic bonding machine having a cathode electrode configured by a plurality of concentric annular electrodes to sequentially apply a voltage from a central annular electrode to a bonding surface. In this method, a bonding portion widens in a radial form from one point on the bonding surface. Therefore, no areas which are surrounded by the interfaces of the plurality of bonding portions as described above will be formed, and it is possible to force out gas generated during the anodic bonding from the bonding surfaces.

However, in the anodic bonding method disclosed in JP-A-63-229853, a DC voltage is first applied to the central annular electrode, and the DC voltage is sequentially applied to the outer annular electrodes. Therefore, the DC voltage application time is different between the central and outer sides of the insulating material being anodically bonded.

In this case, in the bonding portion at the central side of the insulating material, the voltage would be applied for an excessively long period even though it has been bonded completely. Moreover, in the area where the voltage is applied for an excessively long period, much gas will be generated during the anodic bonding. The gas generated at the interface of the metal and the insulating material after the anodic bonding will become the cause of defects of the anodic bonding like the voids.

Therefore, there is a problem in that the bonding surface between the metal and the insulating material anodically bonded by the anodic bonding method disclosed in JP-A-63-229853 exhibits uneven quality between the central and outer sides. This problem will be more noticeable when large-size substrates are anodically bonded.

In addition, when piezoelectric vibrators, semiconductor components, and the like were manufactured by anodically bonding a metal wafer and an insulator wafer in accordance with the anodic bonding method disclosed in JP-A-63-229853, there is a concern that the bonding surface quality becomes uneven between the central and outer sides of the bonding surface of the wafer, thus causing bonding defects in the piezoelectric vibrators, semiconductor components, and the like.

SUMMARY OF THE INVENTION

The present invention has been made in view of the foregoing, and an object of the present invention is to provide an anodic bonding method capable of suppressing uneven quality between the central and outer sides of a bonding surface being anodically bonded. Another object of the present invention is to provide a piezoelectric vibrator manufacturing method capable of improving productivity of a piezoelectric vibrator by using the anodic bonding method in manufacturing the piezoelectric vibrator.

The present invention provides the following means in order to solve the problems.

According to an aspect of the present invention, there is provided an anodic bonding method of anodically bonding a first glass substrate having metal at least partially on a surface thereof and a second glass substrate having a cavity which has an opening on one surface thereof, the method including: a superimposition step of superimposing the first glass substrate and the second glass substrate onto each other in a direction where the metal faces the cavity; a pressurizing step of, subsequent to the superimposition step, pressurizing and holding the first glass substrate and the second glass substrate in a vacuum state in the superimposition direction; and a voltage application step of, subsequent to the pressurizing step, partitioning and setting a plurality of intended bonding areas in a concentric form on a contacting surface where the first glass substrate and the second glass substrate are in contact with each other and applying a DC voltage to each of the plurality of intended bonding areas while sequentially switching the intended bonding areas from a central side of the intended bonding areas towards an outer side in a diameter direction thereof, wherein in the voltage application step, an application time of the DC voltage corresponding to each of the plurality of intended bonding areas is set to be constant for each of the intended bonding areas.

According to the above aspect of the present invention, the DC voltage applied to each area of the first glass substrate and the second glass substrate is the same in any of the concentric intended bonding areas. Therefore, excessive application of the DC voltage at the central side of the concentric intended bonding areas can be suppressed. Thus, it is possible to suppress uneven quality of the bonding surface which is the contacting surface after the anodic bonding.

Here, "metal" includes a metal material, an alloy material, a semiconductor metal material, and the like.

In the voltage application step, it is preferable that a central electrode capable of coming into contact with an outer surface of the second glass substrate overlapping with the center of the intended bonding areas in a thickness direction of the second glass substrate on a side of the second glass substrate opposite to the opening of the cavity is brought into contact with a plurality of annular electrodes which is disposed on another partial area of the outer surface in a concentric form about the central electrode.

In this case, it is possible to apply the DC voltage while sequentially switching the central electrode and the plurality of annular electrodes from the central side toward the outer side. Therefore, it is possible to easily switch the concentric intended bonding areas.

In the voltage application step, it is preferable that the central electrode applies the DC voltage until the first glass substrate and the second glass substrate are anodically bonded on an entire surface of the intended bonding area facing the central electrode.

In this case, when application of the DC voltage by the central electrode is completed, at least the entire surface of the intended bonding area facing the central electrode will be anodically bonded. Thus, it is possible to suppress formation of a non-bonded area.

In the voltage application step, it is preferable that the annular electrodes apply the DC voltage until the first glass substrate and the second glass substrate are anodically bonded on each of the entire surfaces of the intended bonding areas facing the plurality of annular electrodes.

In this case, when application of the DC voltage by the annular electrodes is completed, at least the entire surfaces of the intended bonding areas facing the annular electrodes will be anodically bonded. Thus, it is possible to suppress formation of a non-bonded area.

According to another aspect of the present invention, there is provided a piezoelectric vibrator manufacturing method including the steps of: forming a piezoelectric vibrating reed and an electrode capable of energizing the piezoelectric vibrating reed on a surface of a first glass substrate having metal at least partially on a surface thereof; and anodically bonding a second glass substrate having a cavity which has an opening on one surface thereof and the first glass substrate so as to vacuum-seal the piezoelectric vibrating reed, wherein the step of anodically bonding uses the anodic bonding method according to the above aspect of the present invention.

According to the above aspect of the present invention, the DC voltage applied to each area of the first glass substrate and the second glass substrate is the same in any of the concentric intended bonding areas. Therefore, excessive application of the DC voltage at the central side of the concentric intended bonding areas can be suppressed. Thus, it is possible to suppress uneven quality of the bonding surface which is the contacting surface after the anodic bonding and improve productivity of the piezoelectric vibrator.

According to the anodic bonding method according to the above aspect of the present invention, it is possible to suppress uneven quality between the central and outer sides of a bonding surface being anodically bonded. According to the piezoelectric vibrator manufacturing method according to the above aspect of the present invention, it is possible to improve productivity of a piezoelectric vibrator by using the anodic bonding method in manufacturing the piezoelectric vibrator.

BRIEF DESCRIPTION OF THE DRAWINGS

FIG. 6 is a sectional view schematically showing one step of the anodic bonding method and the piezoelectric vibrator manufacturing method according to the embodiment.

FIG. 9 is a sectional view schematically showing another modification of the structure of a substrate applicable to the anodic bonding method according to the embodiment.

FIG. 10 is a sectional view schematically showing another modification of the structure of a substrate applicable to the anodic bonding method according to the embodiment.

DETAILED DESCRIPTION OF THE INVENTION

Hereinafter, an embodiment of the present invention will be described. In the following description, a piezoelectric vibrator manufacturing method of the present invention will be described in conjunction with an anodic bonding method of the present invention.

Figure 1:
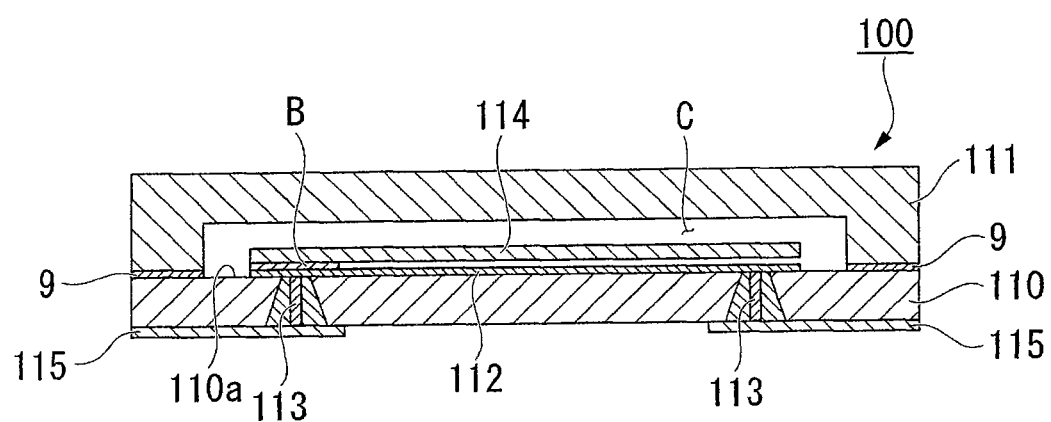
FIG. 1 is a side sectional view showing a piezoelectric vibrator manufactured by an anodic bonding method and a piezoelectric vibrator manufacturing method according to an embodiment of the present invention.

FIG. 1 is a side sectional view showing a piezoelectric vibrator 100 manufactured by a piezoelectric vibrator manufacturing method according to an embodiment of the present invention.

As shown in FIG. 1, a piezoelectric vibrator 100 has a configuration in which a base substrate 110 and a lid substrate 111 which are glass substrates are anodically bonded with a bonding film 9 interposed therebetween so as to bond the base substrate 110 and the lid substrate 111 together.

The base substrate 110 is connected to a piezoelectric vibrating reed 114 which vibrates when electrical power is supplied thereto. In addition, the base substrate 110 is formed with a lead-out electrode 112 which electrically connects the piezoelectric vibrating reed 114 to the outside of the piezoelectric vibrator 100, a penetration electrode 113 which is connected to the lead-out electrode 112 so as to penetrate through the base substrate 110 in a thickness direction thereof, and an outer electrode 115 which is electrically connected to the penetration electrode 113 and exposed to the outside of the piezoelectric vibrator 100.

The bonding film 9 is formed along a mounting surface 110a of the base substrate 110, on which the piezoelectric vibrating reed 114 is mounted, so as to surround the piezoelectric vibrating reed 114. The bonding film 9 is configured by silicon whose thermal expansion coefficient is approximately the same as the base substrate 110 and the lid substrate 111 and can be formed by a well-known film-formation method such as photolithography or sputtering. As a material of the bonding film 9, although semiconductor materials such as silicon can be used, in addition to the semiconductor materials, metallic materials such as aluminum or chrome, alloy materials such as Koval, and the like can be appropriately selected and used.

The lid substrate 111 is formed with a cavity C which is a space in which the piezoelectric vibrating reed 114 is disposed. In addition, the lid substrate 111 is anodically bonded to the bonding film 9 in a state where the piezoelectric vibrating reed 114 is accommodated in the cavity C. That is to say, the lid substrate 111 and the bonding film 9 are bonded by an electrostatic attraction between a space-charge layer in the glass component of the lid substrate 111 and positive electric charges in the bonding film 9 and a covalent bonding between ionized O⁻ (oxygen ions) and silicon atoms.

Figure 2:
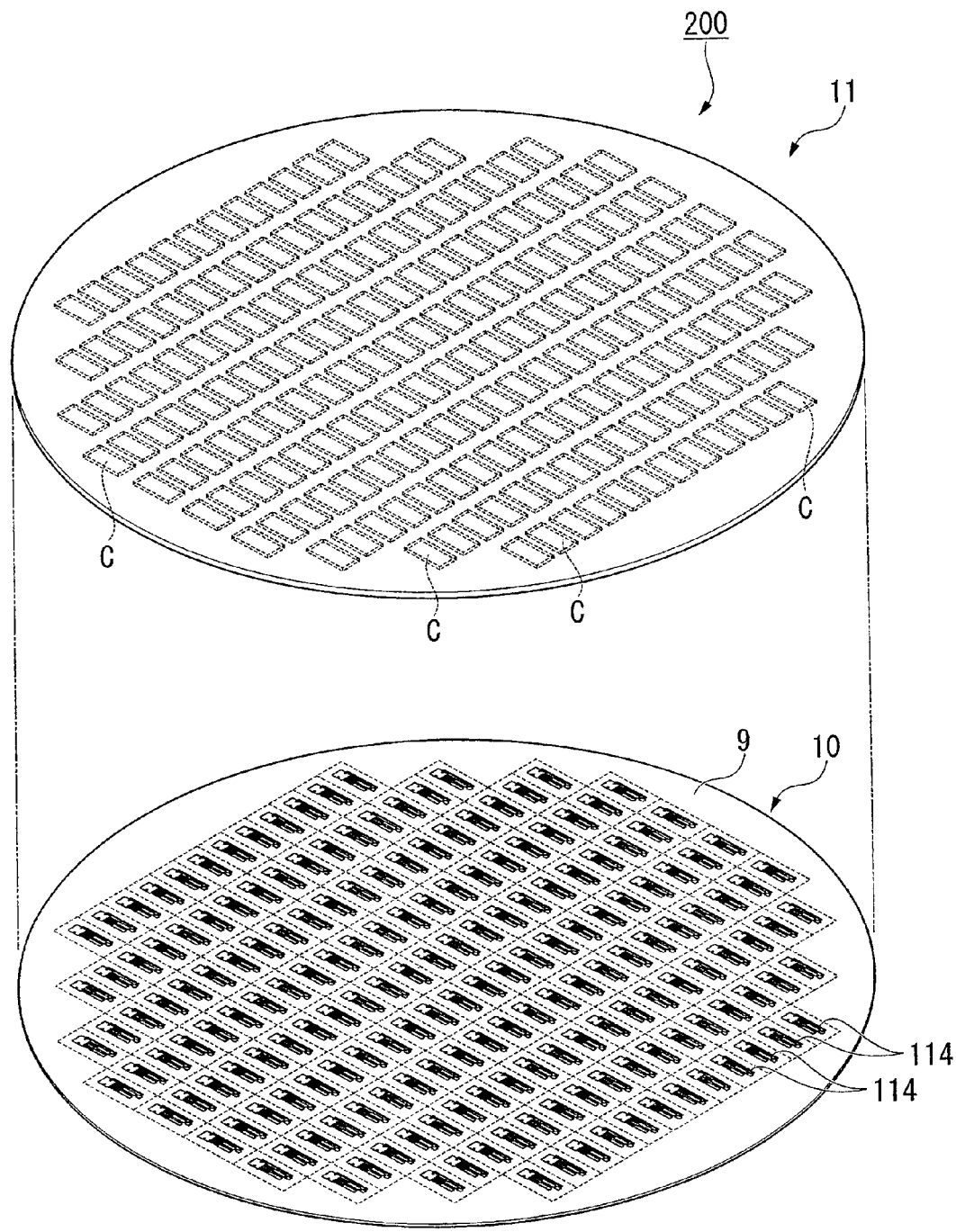
FIG. 2 is an exploded perspective view showing a wafer assembly of the piezoelectric vibrator.

FIG. 2 is an exploded perspective view of a wafer assembly of the piezoelectric vibrator manufactured by the piezoelectric vibrator manufacturing method of the present embodiment.

As shown in FIG. 2, a wafer assembly 200 of the piezoelectric vibrator includes a base wafer 10 (first glass substrate) having a plurality of base substrates 100 and a lid wafer 11 (second glass substrate) having a plurality of lid substrates 111, and the piezoelectric vibrating reed 114 is mounted on each of the plurality of cavities C formed on the lid wafer 11.

Figure 3:
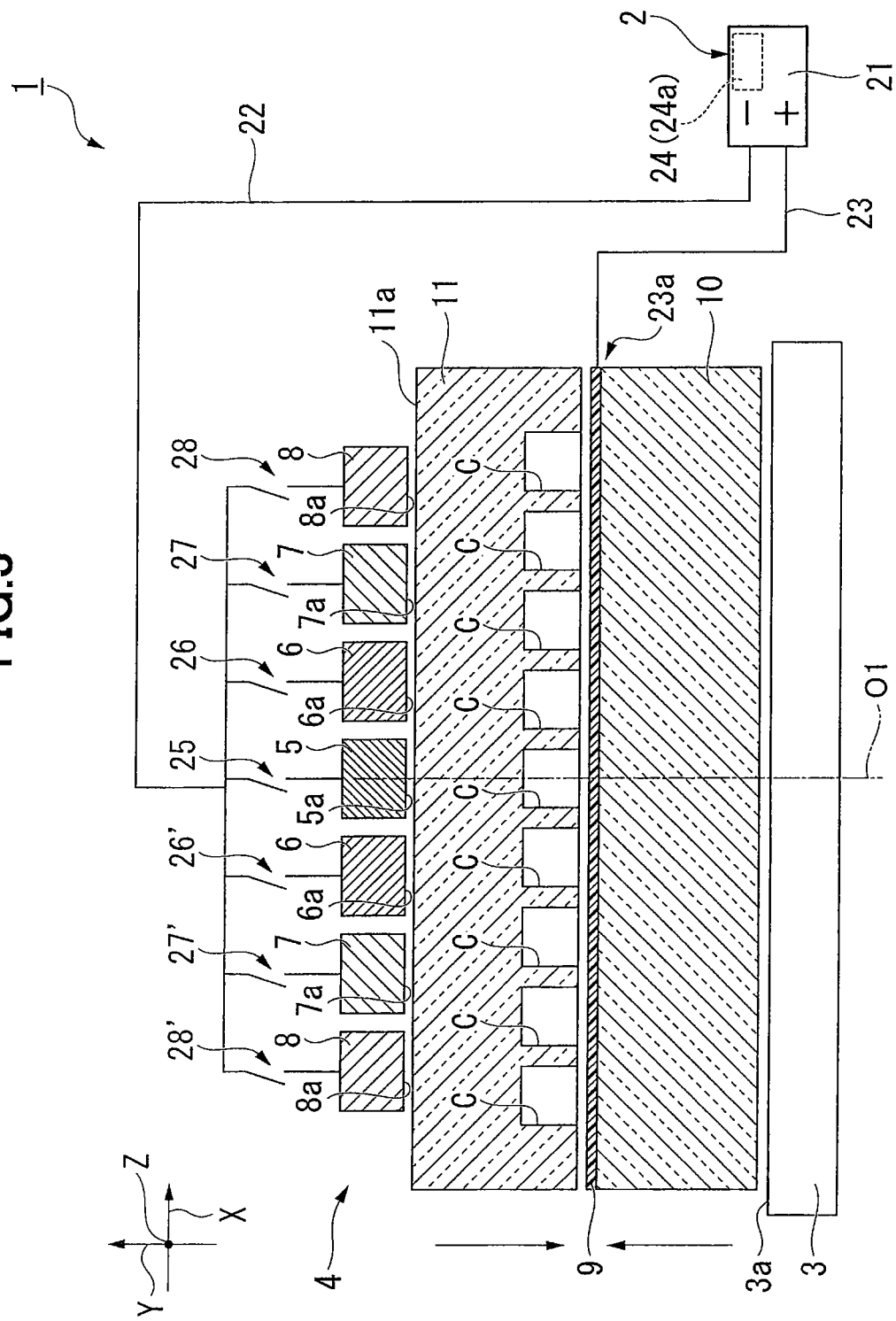
FIG. 3 is a sectional view schematically showing an anodic bonding machine used for the anodic bonding method and the piezoelectric vibrator manufacturing method according to the embodiment.

FIG. 3 is a sectional view schematically showing an anodic bonding machine 1 used in the piezoelectric vibrator manufacturing method of the present embodiment. In FIG. 3, the base wafer 10, lid wafer 11, and bonding film 9 which are subjected to anodic bonding are illustrated together with the anodic bonding machine 1. The symbols X, Y, and Z represent axes perpendicular to each other, and the symbol Z represents an axis perpendicular to the sheet of FIG. 3.

As shown in FIG. 3, the anodic bonding machine 1 is provided with a setting table 3 on which the base wafer 10 and the lid wafer 11 are set, a central electrode 5 which is positioned on an opposite side of the setting table 3 with the base wafer 10 and the lid wafer 11 interposed therebetween and has an approximately circular electrode surface 5a on the side of the setting table 3, and a plurality of annular electrodes 6, 7, and 8 which is disposed in a concentric form about the central electrode 5. Hereinafter, the central electrode 5 and the annular electrodes 6, 7, and 8 are sometimes collectively referred to as "a cathode electrode 4".

The annular electrodes 6, 7, and 8 are formed so that respective electrode surfaces (specifically, electrode surfaces 6a, 7a, and 8a) capable of coming into contact with an outer surface 11a of the lid wafer 11 on a side opposite to the side where the cavity C is opened are arranged in a concentric form about the electrode surface 5a.

Specifically, in the present embodiment, the electrode surface 5a is a circular surface, and the electrode surfaces 6a, 7a, and 8a are surfaces that extend in a strip or ring form having a width.

In the present embodiment, although the outer surface 11a of the lid wafer 11 is formed to be substantially flat, the outer surface 11a may not be a perfect flat surface but may have an appropriate shape as long as the electrode surfaces can make close contact with the outer surface 11a.

The setting table 3 has a setting surface which is flat.

The setting table 3 and the cathode electrode 4 are moved toward or away from each other by an appropriate pressing jig not shown. The base wafer 10 and the lid wafer 11 disposed between the setting table 3 and the cathode electrode 4 are pressed and fixed when the setting table 3 and the cathode electrode 4 are moved toward each other by the pressing jig. The pressing force exerted between the base wafer 10 and the lid wafer 11 is preferably between 10 N and 100 N.

As the material of the setting table 3, a material having a strength capable of enduring the pressing and fixing is preferred, and for example, existing hard materials such as stainless steel can be appropriately selected and used considering durability, cost, workability, and the like.

The bonding film 9 and the cathode electrode 4 are connected to a power supply 2 that generates a DC voltage. The power supply 2 includes a main unit 21 that generates a DC voltage, a cathode-side wiring 22 that electrically connects a negative terminal of the main unit 21 to the cathode electrode 4, and an anode-side wiring 23 that electrically connects a positive terminal of the main unit 21 to the bonding film 9.

A voltage application portion 23a which is detachably attached to the bonding film 9 is provided at an end of the anode-side wiring 23 on a side opposite to the side connected to the positive terminal of the main unit 21. The voltage application portion 23a can be configured, for example, by a clip-shaped terminal that is pressed and fixed with the bonding film 9 interposed therebetween or a plate spring-shaped terminal capable of coming into contact with the bonding film 9. In addition, the anode-side wiring 23 itself may be fixed to the base wafer 10 so as to be electrically connected to the bonding film 9.

In the present embodiment, the power supply 2 is provided with a control unit 24 that has a timer mechanism 24a measuring an application time of a DC voltage, and the control unit 24 is capable of controlling the DC voltage application time based on a setting time which is set in advance. The details of the application time will be described later. The application times to the central electrode 5 and the annular electrodes 6, 7, and 8 of the cathode electrode 4 are individually set as application times T1, T2, T3, and T4, respectively.

Between the cathode-side wiring 22 and the cathode electrode 4, switches 25 to 28 are disposed so as to switch on and off application of the DC voltage. More specifically, the switch 25 is disposed between the cathode-side wiring 22 and the central electrode 5. In addition, the switch 26 is disposed between the cathode-side wiring 22 and the annular electrode 6. Moreover, the switch 27 is disposed between the cathode-side wiring 22 and the annular electrode 7. Furthermore, the switch 28 is disposed between the cathode-side wiring 22 and the annular electrode 8.

Switches 26', 27', and 28' represent the same switches as the switches 26, 27, and 28, and they are schematically illustrated to describe electrical connection between the annular electrodes 6, 7, and 8 which are formed in an annular form.

Next, an anodic bonding method and a piezoelectric vibrator manufacturing method according to the present embodiment using the anodic bonding machine 1 having the configuration described above will be described.

Figure 4:
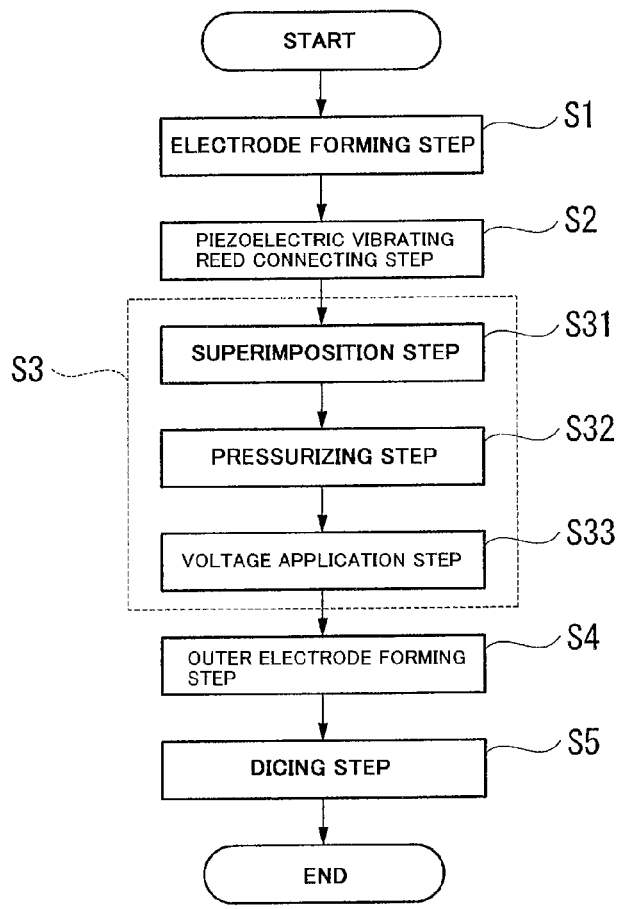
FIG. 4 is a flowchart showing the manufacturing procedure of the piezoelectric vibrator manufacturing method according to the embodiment.

FIG. 4 is a flowchart showing a manufacturing procedure of the piezoelectric vibrator manufacturing method according to the present embodiment.

The piezoelectric vibrator manufacturing method starts with step S1. Step S1 is an electrode forming step where an electrode is foamed on the base wafer 10 shown in FIG. 2 on which the glass substrate is formed.

In step S1, an electrode layer serving as the lead-out electrode 112 of the base substrate 110 shown in FIG. 1 and the penetration electrode 113 penetrating through the base substrate 110 in the thickness direction are formed on the base wafer 10 shown in FIG. 2 by a well-known method.

When the lead-out electrode 112 and the penetration electrode 113 are formed, step S1 ends, and the flow proceeds to step S2.

Step S2 is a piezoelectric vibrating reed connecting step where a plurality of piezoelectric vibrating reed 114 is mounted on the base wafer 10.

In step S2, connection points 112a of the lead-out electrodes 112 and the piezoelectric vibrating reeds 114 are connected by bumps B (see FIG. 1) made of gold, solder, or the like.

When the piezoelectric vibrating reeds 114 are connected to the base wafer 10, step S2 ends, and the flow proceeds to step S3.

Step S3 is a step that corresponds to the anodic bonding method according to the present embodiment. In addition, step S3 is an anodic bonding step of anodically bonding the base wafer 10 and the lid wafer 11.

In step S3, the base wafer 10 and the lid wafer 11 are anodically bonded in a vacuum state and under a predetermined temperature atmosphere (in the present embodiment, temperature of about 300° C. to 400° C.), and the piezoelectric vibrating reeds 114 (see FIG. 2) disposed in the cavities C are vacuum-sealed. In step S3, the three steps S31, S32, and S33 described below are performed in that order.

Step S31 is a superimposition step where the base wafer 10 and the lid wafer 11 are superimposed onto each other.

In step S31, the base wafer 10 and the lid wafer 11 are superimposed onto each other and set on the setting table 3 so that the bonding film 9 on the base wafer 10 comes into contact with the lid wafer 11 (see FIGS. 2 and 3). At that time, each of the cavities C is positioned so as to surround each of the piezoelectric vibrating reeds 114 (see FIG. 2). In addition, the setting table 3 and the cathode electrode 4 are moved toward each other in the Y axis direction shown in FIG. 3, so that each of the electrode surfaces 5a, 6a, 7a, and 8a comes into contact with the outer surface 11a of the lid wafer 11. At that time, each of the cavities C formed on the lid wafer 11 becomes an isolated space when the bonding film 9 comes into contact with the lid wafer 11.

In addition, in a state where the electrode surfaces 5a, 6a, 7a, and 8a are in contact with the lid wafer 11 to an extent that the base wafer 10 and the lid wafer 11 slide over each other in a direction (the XZ plane direction shown in FIG. 3) where the bonding film 9 extends on the base wafer 10, the relative positional relationship between the base wafer 10 and the lid wafer 11 is corrected and is then temporarily fixed by the pressing jig described above.

When the base wafer 10 and the lid wafer 11 are positioned and superimposed onto each other on the setting table 3, step S31 ends, and the flow proceeds to step S32.

Step S32 is a pressurizing step where the base wafer 10 and the lid wafer 11 are pressurized and held in a sandwiched manner.

In step S32, the base wafer 10 and the lid wafer 11 being superimposed are inserted into a well-known vacuum chamber for each of the pressing jigs and the inside of the vacuum chamber is depressurized to create a vacuum state. The setting table 3 and the cathode electrode 4 are moved further toward each other, and the base wafer 10 and the lid wafer 11 are pressurized in the thickness direction with the bonding film 9 interposed therebetween. In the present embodiment, the pressing force exerted between the base wafer 10 and the lid wafer 11 reaches a specified pressure between 10 N and 100 N, the setting table 3 and the cathode electrode 4 stop moving toward each other so that the base wafer 10 and the lid wafer 11 are maintained at the interposed state. The pressing force exerted between the base wafer 10 and the lid wafer 11 can be appropriately set to an optimum value in accordance with the materials of the base wafer 10, the lid wafer 11, and the bonding film 9.

When the base wafer 10 and the lid wafer 11 are interposed by the prescribed pressure, step S32 ends, and the flow proceeds to step S33.

Step S33 is a voltage application step where the power supply 2 (see FIG. 3) applies a DC voltage between the cathode electrode 4 and the bonding film 9. The DC voltage in step S33 is about several kV to several tens of kV. The voltage can be appropriately set depending on the subjects to be anodically bonded.

Figure 5:
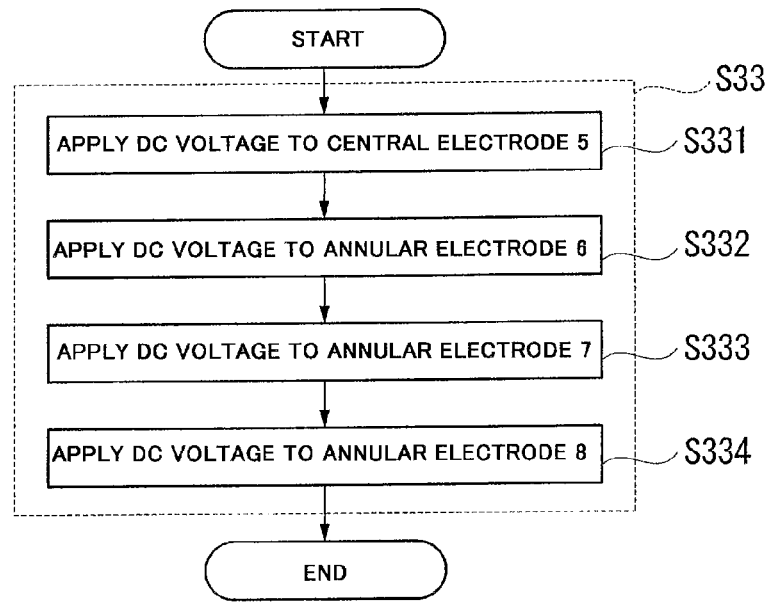
FIG. 5 is a flowchart showing the details of a part of the steps shown in FIG. 3.

FIG. 5 is a flowchart showing the details of step S33. In addition, FIGS. 6 and 7 are sectional views schematically showing the anodic bonding machine 1 during one process of step S33.

As shown in FIG. 5, in step S33, the four steps S331 to S334 described below are performed in that order.

Step S331 is a step of applying a DC voltage to the central electrode 5.

In step S331, as shown in FIG. 6, the switch 25 is put into the ON state (voltage applicable state), and the switches 26, 27, and 28 are put into the OFF state (voltage non-applicable state). Subsequently, the power supply 2 starts applying a DC voltage. In the control unit 24 of the power supply 2, the application time T1 which is time suitable for achieving anodic bonding between the base wafer 10 and the lid wafer 11 with the central electrode 5 is set in advance, and the application of the DC voltage by the power supply 2 is continued for only the application time T1. In this way, as shown in FIG. 6, the DC voltage is applied to an intended bonding area A1 for only the application time T1, where the intended bonding area A1 is an area on the bonding film 9 which is to be bonded and which overlaps with a surface being in contact with the central electrode 5 in the thickness direction of the lid wafer 11.

The bonding film 9 and the lid wafer 11 are anodically bonded on a surface (hereinafter referred to as "a bonding surface Q1") of the intended bonding area A1 between the bonding film 9 and the lid wafer 11. When the application time T1 expires, the application of the DC voltage by the power supply 2 is stopped by the timer mechanism 24a. By doing so, the application of the DC voltage to the central electrode 5 ends. In this way, step S331 ends, and the flow proceeds to step S332.

As shown in FIG. 5, step S332 is a step of applying the DC voltage to the annular electrode 6.

In step S332, the switch 25 is put into the OFF state, and the switch 26 is put into the ON state. At that time, the intended bonding area to which the DC voltage is applied is switched from the intended bonding area A1 to an intended bonding area A2 shown in FIG. 7A, which is an area on the bonding film 9 overlapping with the surface being in contact with the annular electrode 6 in the thickness direction of the lid wafer 11.

Subsequently, the power supply 2 starts applying the DC voltage to the annular electrode 6. The application time T2 during which the DC voltage is applied by the annular electrode 6 is the same as the application time T1. When the application time T2 expires, the application of the DC voltage by the power supply 2 is stopped by the timer mechanism 24a. At that time, the bonding film 9 and the lid wafer 11 are anodically bonded on a surface (hereinafter referred to as "a bonding surface Q2") of the intended bonding area A2 between the bonding film 9 and the lid wafer 11. In this way, step S332 ends, and the flow proceeds to step S333.

As shown in FIG. 5, step S333 is a step of applying the DC voltage to the annular electrode 7.

In step S333, the switch 26 is put into the OFF state, and the switch 27 is put into the ON state. At that time, the area to which the DC voltage is applied is switched from the intended bonding area A2 to an intended bonding area A3 shown in FIG. 7B which is an area on the bonding film 9 overlapping with the surface being in contact with the annular electrode 7 in the thickness direction of the lid wafer 11.

Subsequently, the power supply 2 starts applying the DC voltage to the annular electrode 7. Here, the application time T3 during which the power supply 2 applies the DC voltage via the annular electrode 7 is the same as the application time T1. That is, the lengths of the application times T1, T2, and T3 are the same. When the application time T3 expires, the application of the DC voltage by the power supply 2 is stopped by the timer mechanism 24a. At that time, the bonding film 9 and the lid wafer 11 are anodically bonded on a surface (hereinafter referred to as "a bonding surface Q3") of the intended bonding area A3 between the bonding film 9 and the lid wafer 11. In this way, step S333 ends, and the flow proceeds to step S334.

Step S334 is a step of applying the DC voltage to the annular electrode 8.

In step S334, the switch 27 is put into the OFF state, and the switch 28 is put into the ON state. At that time, an area to which the DC voltage is applied is switched from the intended bonding area A3 to an intended bonding area A4 shown in FIG. 7B which is an area on the bonding film 9 overlapping with the surface being in contact with the annular electrode 8 in the thickness direction of the lid wafer 11.

Here, the application time T4 during which the power supply 2 applies the DC voltage via the annular electrode 8 is the same as the application time T1. Therefore, the DC voltage application time is the same in any of the intended bonding areas A1, A2, A3, and A4. When the application time T4 expires, the application of the DC voltage by the power supply 2 is stopped by the timer mechanism 24a. At that time, the bonding film 9 and the lid wafer 11 are anodically bonded on a surface (hereinafter referred to as "a bonding surface Q4") of the intended bonding area A4 between the bonding film 9 and the lid wafer 11. In this way, step S334 ends.

When step S334 ends, the bonding film 9 on the base wafer 10 and the lid wafer 11 are anodically bonded, and all the cavities C formed between the base wafer 10 and the lid wafer 11 are vacuum-sealed. Therefore, the piezoelectric vibrating reeds 114 (see FIG. 1) are vacuum-sealed at the inside of the cavities C which are formed when the base wafer 10 and the lid wafer 11 are anodically bonded.

In this way, step S33 ends, and step S3 (anodic bonding step) including the steps S31 (interposing step), S32 (pressurizing step), and S33 (voltage application step) ends.

After the step S3 ends, the outer electrodes 115 shown in FIG. 1 are formed on the wafer assembly of the piezoelectric vibrator by a well-known method (step S4: outer electrode forming step; see FIG. 4). Subsequently, the piezoelectric vibrator wafer assembly 200 which is a bonding assembly of the base wafer 10 and the lid wafer 11 is cut in a direction perpendicular to the surfaces of the base wafer 10 and the lid wafer 11 so that the bonding film 9 is exposed to the cutting surface and the cavities C are maintained in the vacuum-sealed state. In this way, the piezoelectric vibrator wafer assembly 200 is divided into the individual piezoelectric vibrators 100 shown in FIG. 1 (step S5: dicing step; see FIG. 4).

By the above steps, the manufacturing process of the piezoelectric vibrator 100 shown in FIG. 1 ends. Subsequent to step S5 (dicing step), a post-processing step of coating the piezoelectric vibrators with a resin mold or the like or transferring them to a carriage case may be appropriately performed as necessary.

As described above, according to the anodic bonding method (anodic bonding step S3) of the present embodiment, in step S33, the base wafer 10 and the lid wafer 11 are anodically bonded in a concentric manner from the central axis O1 toward the outer side. Therefore, it is possible to effectively remove bubbles or the like between the base wafer 10 and the lid wafer 11 and suppress formation of voids. In addition, the DC voltage application time is the same in any of the intended bonding areas A1, A2, A3, and A4 of the base wafer 10 and the lid wafer 11. That is to say, in areas extending from the central electrode 5 at the central side of the cathode electrode 4 to the annular electrode 8 at the outer side of the cathode electrode 4, the DC voltage applied to each area of the base wafer 10 and the lid wafer 11 is the same in any of the central electrode 5 and the annular electrodes 6, 7, and 8. Therefore, excessive voltage application in the intended bonding area where the base wafer 10 and the lid wafer 11 are anodically bonded can be suppressed. Thus, it is possible to suppress uneven quality between the central and outer sides of the bonding surface being anodically bonded.

In addition, in step S33 (voltage application step), it is possible to apply the DC voltage while switching the intended bonding areas (intended bonding areas A1, A2, A3, and A4) in a concentric manner from the central electrode 5 toward the outer side by using the central electrode 5 and the plurality of annular electrodes 6, 7, and 8 arranged in a concentric form. Therefore, it is possible to easily switch the intended bonding areas.

When the application of the DC voltage by the central electrode 5 is completed, at least the entire surface of the intended bonding area A1 facing the central electrode 5 will be anodically bonded. Therefore, it is possible to suppress formation of a non-bonded area on the interface of the intended bonding areas A1 and A2 and the intended bonding area A1.

When the application of the DC voltage by the annular electrodes 6, 7, and 8 is completed, at least the entire surfaces of the intended bonding areas A2, A3, and A4 facing the annular electrodes 6, 7, and 8 will be anodically bonded. Therefore, it is possible to suppress formation of a non-bonded area on an entire surface extending from the intended bonding area A2 to the intended bonding area A4.

In this way, it is possible to suppress formation of the non-bonded area on the entire surface extending from the intended bonding area A1 to the intended bonding area A4 by using the central electrode 5 and the annular electrodes 6, 7, and 8.

In addition, according to the piezoelectric vibrator manufacturing method of the present embodiment, the application time of the DC voltage corresponding to each of the intended bonding areas A1, A2, A3, and A4 is constant. Therefore, since the application time of the DC voltage in each area of the base wafer 10 and the lid wafer 11 is constant, excessive voltage application in the intended bonding area where the base wafer 10 and the lid wafer 11 are anodically bonded can be suppressed. Thus, it is possible to suppress uneven quality of the bonding surface at different positions on the base wafer 10 and the lid wafer 11. Therefore, it is possible to achieve anodic bonding while suppressing generation of voids and uneven quality and increase the productivity of the piezoelectric vibrator.

Modification

Hereinafter, an anodic bonding method and a piezoelectric vibrator manufacturing method according to a modification of the present embodiment will be described.

First Modification

Another configuration of a base wafer applicable to the above-described anodic bonding method will be described.

Figure 8:
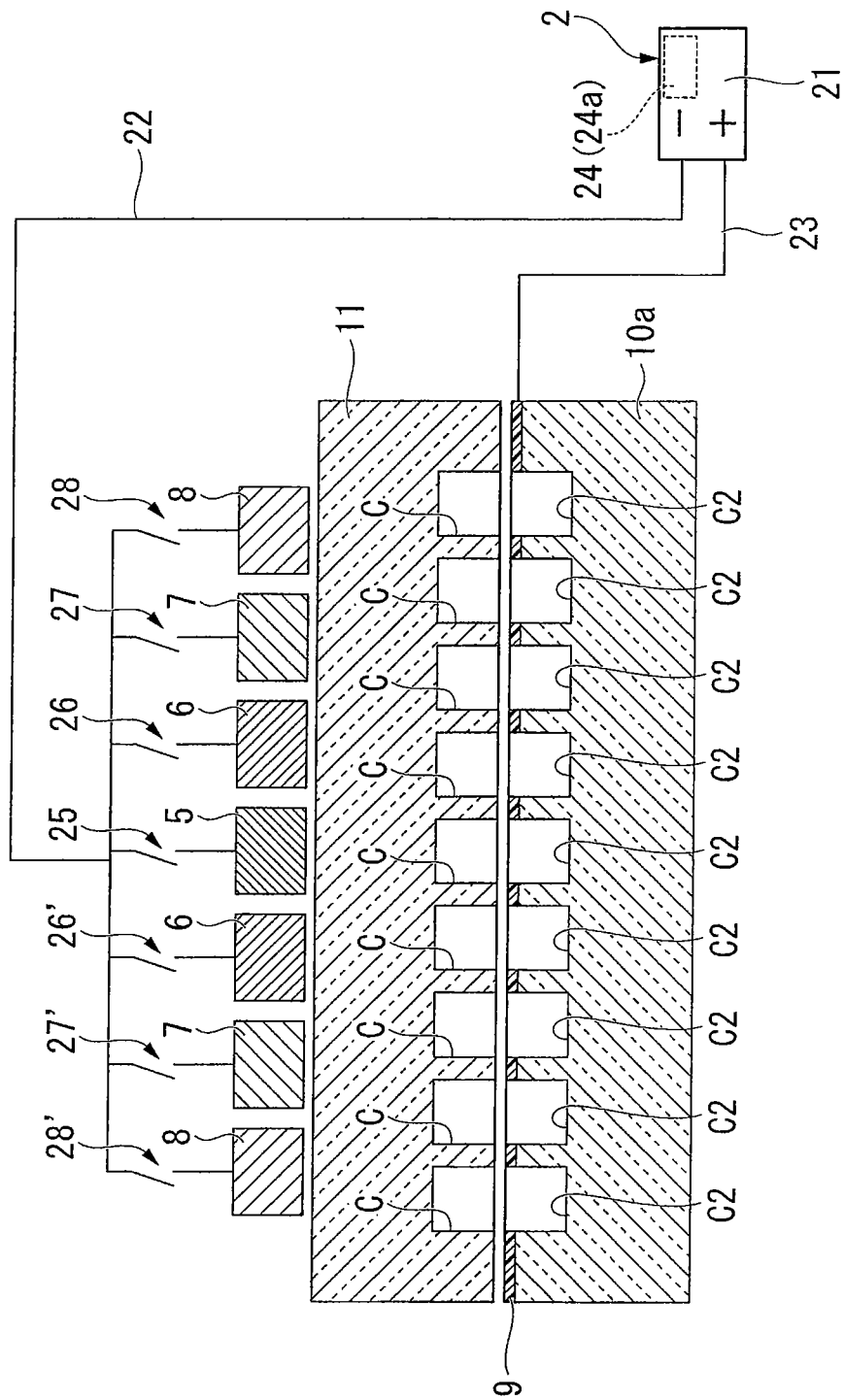
FIG. 8 is a sectional view schematically showing a modification of the structure of a substrate applicable to the anodic bonding method according to the embodiment.

FIG. 8 is a sectional view showing the configuration of a base wafer and a lid wafer which can be applied to the anodic bonding method according to the above-described embodiment.

As shown in FIG. 8, in this modification, a base wafer 10a is used in place of the base wafer 10. The base wafer 10a has second cavities C2 which are disposed at positions where they face the cavities C in a state where the base wafer 10a is superimposed onto the lid wafer 11 and which have an opening having the same shape and size as the opening of each of the cavities C of the lid wafer 11 so that the openings can be superimposed on the openings of the cavities C. When the base wafer 10a and the lid wafer 11 are superimposed in the superimposition step (step S31), the openings of the cavities C oppose the openings of the cavities C2, and the cavities C and C2 each form one isolated space.

In the case of the base wafer 10a having such a shape, similar to the above-described embodiment, it is possible to achieve anodic bonding between the bonding film 9 provided on the base wafer 10a and the lid wafer 11 with the bonding film 9 serving as the anode.

Second Modification

A second modification of the above-described embodiment will be described.

FIG. 9 is a sectional view showing the configuration of a base substrate and a lid substrate which can be applied to the anodic bonding method according to the above-described embodiment. As shown in FIG. 9, in this modification, the anodic bonding machine 1 is provided with an anode electrode 30 having the function of an anode in place of the setting table 3. The anode electrode 30 has a setting surface 3a on which the base wafer 10 is set, similarly to the setting table 3, and which is made of a conductive material. In this modification, the bonding film 9 of the base wafer 10 is not used as the electrode of the anodic bonding.

In this modification, the positive terminal of the power supply 2 and the anode electrode 30 are connected by the anode-side wiring 23. In this way, positive ions of the lid wafer 11 are moved towards the cathode electrode 4 between the bonding film 9 and the lid wafer 11, whereby the bonding film 9 and the lid wafer 11 can be anodically bonded similarly to the above-described embodiment.

As shown in FIG. 10, the configuration of this modification can be suitably applied to a base wafer 10a having the cavities C2 shown in the first modification.

Third Modification

A third modification of the above-described embodiment will be described.

In this modification, the setting values of the lengths of the application times T1, T2, T3, and T4 in the above-described embodiment are different from the setting values.

First, as shown in FIG. 6, a DC voltage is applied to the central electrode 5 to form the bonding surface Q1 in the intended bonding area A1 which is the same as the above-described embodiment.

Figure 7A:
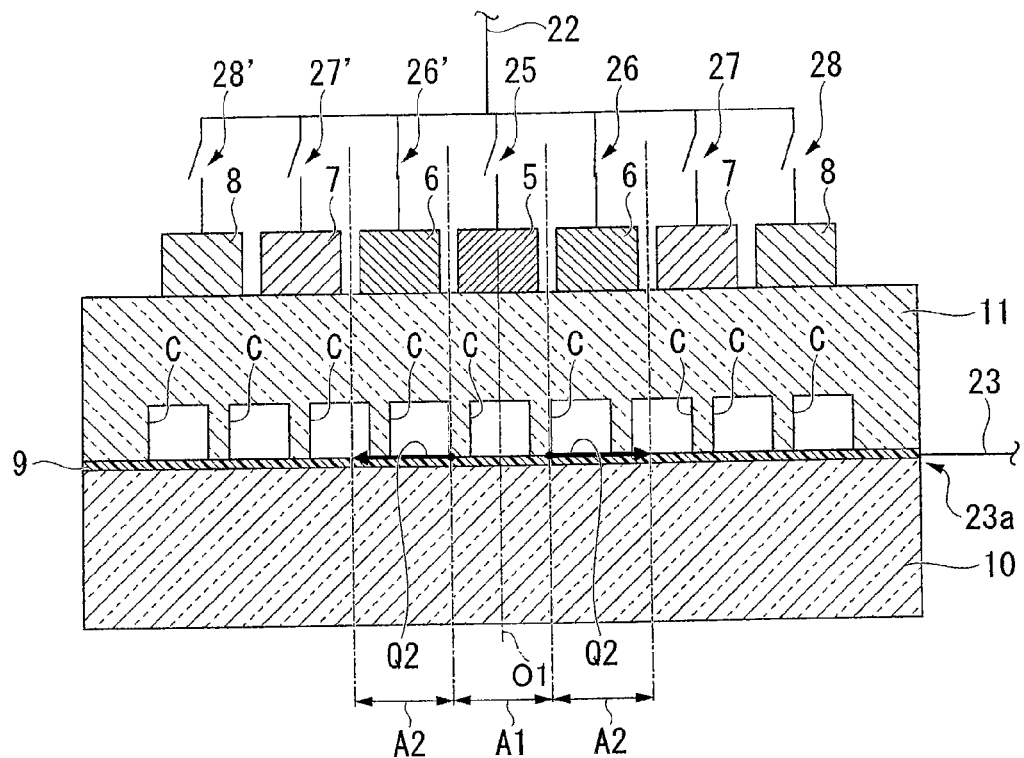
FIGS. 7A and 7B are sectional views schematically showing one step of the anodic bonding method and the piezoelectric vibrator manufacturing method according to the embodiment.
Figure 7B:
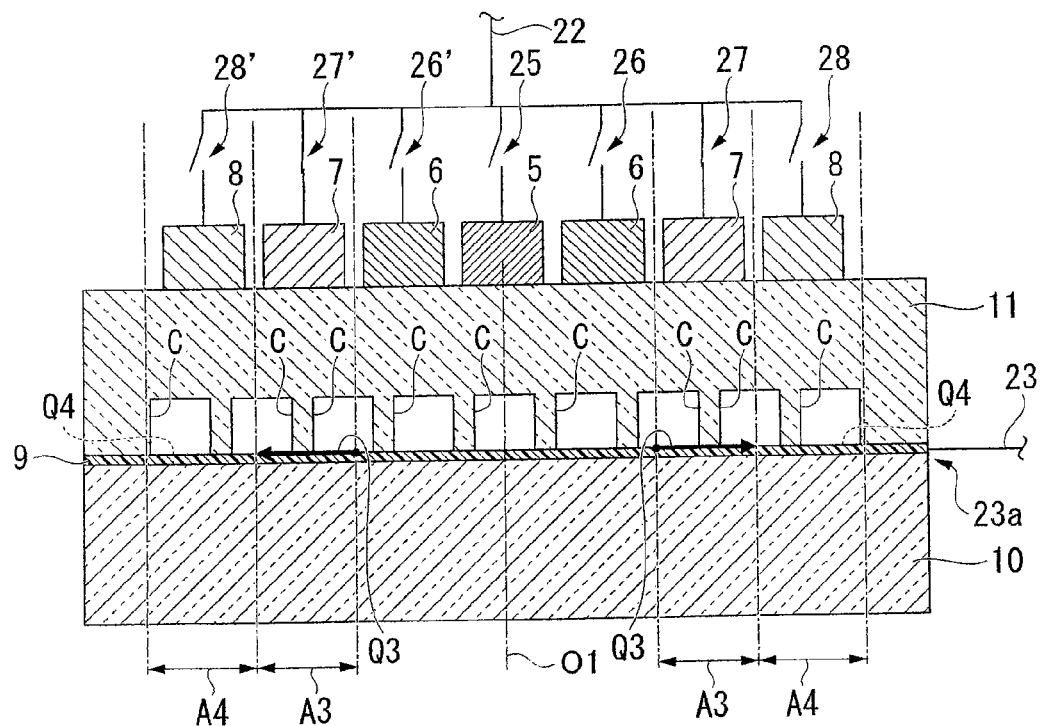

Subsequently, the intended bonding area A2 shown in FIG. 7A is anodically bonded by using the central electrode 5. In the related art, a method of bringing a needle-like electrode into contact with one point on a substrate to widen the bonding surface (for example, the bonding surface Q1) in a radial form (concentric form) from the one point is known. In this modification, it is possible to widen the bonding surface in the order of the bonding surfaces Q1 and Q2 by using the central electrode 5. That is, an application time T1' during which the DC voltage is applied by the central electrode 5 is longer than the application time T1, and the application time T1' is set to a time during which the bonding surfaces Q1 and Q2 of the intended bonding areas A1 and A2 are anodically bonded.

Subsequently, at a point in time when the anodic bonding is completed in the intended bonding area A2, the switch 25 is put into the OFF state, and the switch 26 is put into the ON state. By doing so, differently from the above-described embodiment, the intended bonding area A3 is anodically bonded by the annular electrode 6. An application time T2' during which the DC voltage is applied by the annular electrode 6 is set to be the same as the application time T3.

In this way, by sequentially switching the intended bonding areas A1, A2, and so on toward the outer side subsequently to the widening of the bonding surfaces Q1, Q2, and so on, it is possible to suppress formation of voids in the interface between the bonding surface being anodically bonded and the non-bonded surface which is not anodically bonded and disposed at the outer side of the bonding surface.

Although the embodiments of the present invention have been described in detail with reference to the drawings, the detailed configuration is not limited to the embodiments, and various changes can be made in design without departing from the spirit of the present invention.

For example, in the above-described embodiments, the central electrode 5 was illustrated as having such a shape that it makes surface contact with the outer surface of the lid wafer 11, the shape of the central electrode 5 is not limited to this and may have an appropriate shape such as a needle or rod-like shape.

In addition, the electrode surfaces 5a to 8a need to be positioned in a concentric form about the electrode surface 5a. For example, the electrode surface 5a may have a planar shape other than the circular shape, and the electrode surfaces 6a, 7a, and 8a may be surfaces extending in an annular shape other than a ring shape.

In addition, in the above-described embodiments, although the application time of the DC voltage was controlled based on the setting time in the control unit 24, the present invention is not limited to this, and a user may appropriately manually control the operation of the power supply 2.

In addition, in the above-described embodiments, although the application time of the DC voltage was described as being the setting time which is set in advance, the present invention is not limited to this. The control unit 24 may stop the application of the DC voltage based on a change in a current value corresponding to the DC voltage that the power supply 2 applies to the central electrode 5 by assuming that the point in time when the current value has decreased to be equal to or lower than a preset threshold value is the time when the anodic bonding is completed. At that time, the control unit is able to calculate the application time of the DC voltage to the annular electrodes 6, 7, and 8 based on the application time during which the DC voltage was actually applied to the central electrode 5. In this case, the same effects as those obtained by the anodic bonding method and the piezoelectric vibrator manufacturing method of the above-described embodiments can be obtained. Moreover, it is possible to save time and effort for setting the setting time in advance when subjects which are to be anodically bonded and made of different materials are anodically bonded.

In addition, in the above-described embodiments, although three annular electrodes 6, 7, and 8 were used, the number of annular electrodes is not particularly limited as long as there are many annular electrodes.

In addition, the central electrode 5 may be disposed at any position on the outer surface 11a of the lid wafer 11. In this case, by sequentially switching the intended bonding areas which are set in a concentric form about the central electrode 5 and achieving the anodic bonding, it is possible to obtain the effects of the present invention.

In addition, although the above-described embodiments have been described for the method of switching the intended bonding areas by using the cathode electrodes 4 which includes the central electrode 5 and the annular electrodes 6, 7, and 8, the present invention is not limited to this. For example, in a configuration where the anode electrode 30 is used as illustrated in the second modification, the intended bonding areas may be switched on the anode side by using the anode electrode 30 which includes the central electrode and the plurality of annular electrodes. The same effects as the present invention can be obtained in such a configuration.

The invention claimed is:

1. A method for producing piezoelectric vibrators each containing a piezoelectric vibrating strip inside, comprising:
   (a) defining a plurality of first substrates on a first wafer and a plurality of second substrates on a second wafer;
   (b) forming a bonding film on the first wafer and the second wafer;
   (c) layering, between a boding electrode and a table, the first and second wafers such that one of the first substrates on the first wafer substantially coincides with a corresponding second substrate of the second substrates on the second wafer, with the bonding film being placed between a plurality of pairs of coinciding first and second substrates, wherein the bonding electrode comprises a plurality of electrode members one inside another;
   (d) forming a piezoelectric vibrator comprising the pair of coinciding first and second substrates and the piezoelectric vibrating strip; and
   (e) anodically bonding the first wafer and the second wafer by applying a bonding voltage to the bonding electrode in such a manner as to turn on and off the electrode members sequentially from an inner electrode member to an outer electrode member.

2. The method according to claim 1, wherein the plurality of electrode members comprise an innermost member and annular members.

3. The method according to claim 2, wherein the annular members are concentric on the innermost member.

4. The method according to claim 1, wherein the innermost member is circular.

5. The method according to claim 1, wherein the innermost member is pointing.

6. The method according to claim 1, wherein layering the first and second wafers comprises layering the first and second wafers under a pressure within the range from 10N to 100N.

7. The method according to claim 1, wherein applying the bonding voltage to the bonding electrode comprises not turning on one electrode member before turning off an immediate inner electrode member.

8. The method according to claim 7, wherein applying the bonding voltage to the bonding electrode comprises turning on one electrode member concurrently with turning off an immediate inner electrode member.

9. The method according to claim 1, wherein a time duration during which a respective electrode member is on is substantially equal.

10. The method according to claim 1, wherein a time duration during which a respective electrode member is on varies.

11. The method according to claim 1, wherein the step (e) comprises defining a predetermined time duration during which a respective electrode member is on and anodically bonding an area of the first and second wafers overlapped by the respective electrode member during the predetermined time duration.

12. The method according to claim 1, further comprising defining a predetermined time duration during which a respective electrode member is on, comprising:
   defining a time duration during which an inner most electrode member is on so as to anodically bond an area of the first and second wafers overlapped by the innermost electrode member and an immediately outer electrode member to the innermost electrode member.

13. The method according to claim 1, further comprising defining a time duration during which a respective electrode member is on based on an electric current flowing therethrough.

14. The method according to claim 13, further comprising turning off a respective electrode member when an electric current flowing therethrough goes below a threshold.

15. The method according to claim 1, wherein applying a bonding voltage to the bonding electrode comprises applying a bonding voltage across the bonding electrode and the boding film.

16. The method according to claim 1, wherein applying a bonding voltage to the bonding electrode comprises applying a bonding voltage across the bonding electrode and the table.

* * * * *